United States Patent
Oh et al.

(10) Patent No.: US 7,068,886 B2
(45) Date of Patent: Jun. 27, 2006

(54) MILLIMETER WAVE OSCILLATOR USING FIBER BRAGG GRATING

(75) Inventors: Myoung Sook Oh, Daejeon (KR); Ho Young Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/248,467

(22) Filed: Oct. 12, 2005

(65) Prior Publication Data

US 2006/0083464 A1    Apr. 20, 2006

(30) Foreign Application Priority Data

Oct. 18, 2004    (KR)    ............... 10-2004-0083336

(51) Int. Cl.
*G02B 6/34*    (2006.01)
*H04J 14/02*    (2006.01)
*H01S 3/00*    (2006.01)

(52) U.S. Cl. ............... 385/37; 385/1; 385/42; 385/24; 372/6; 398/82; 398/83; 398/84; 398/91; 359/337.21; 359/341.1

(58) Field of Classification Search ............ 385/1, 385/2, 3, 24, 8, 9, 10, 37, 42, 40; 372/6; 398/82, 83, 84, 87, 91, 46; 359/337, 21, 359/341.1, 341.3, 341.31
See application file for complete search history.

(56) References Cited

U.S. PATENT DOCUMENTS

| | | | |
|---|---|---|---|
| 5,323,404 A * | 6/1994 | Grubb | 372/6 |
| 5,379,309 A | 1/1995 | Logan, Jr. | 372/18 |
| 5,485,481 A | 1/1996 | Ventrudo et al. | 372/6 |
| 6,559,994 B1 | 5/2003 | Chen et al. | 359/180 |
| 6,608,949 B1 * | 8/2003 | Kim et al. | 385/27 |
| 6,681,065 B1 | 1/2004 | Minasian et al. | 385/27 |
| 6,917,633 B1 * | 7/2005 | Kim et al. | 372/20 |
| 2003/0219257 A1 | 11/2003 | Williams et al. | 398/152 |
| 2003/0223757 A1 * | 12/2003 | Yamamoto et al. | 398/146 |

OTHER PUBLICATIONS

'Highly Stabilized Millimeter-Wave Generation by Using Fiber-Optic Frequency-Tunable Comb Generator' Kitayama, IEEE Journal Of Lightwave Technology, vol. 15, No. 5, May 1997, pp. 883-893.

'60 GHz Millimeter-Wave Source Using Two-Mode Injection-Locking of a Fabry-Perot Slave Laser' Ogusu et al., IEEE Microwave And Wireless Components Letters, vol. 11, No. 3, Mar. 2001, pp. 101-103.

* cited by examiner

*Primary Examiner*—Brian M. Healy
(74) *Attorney, Agent, or Firm*—Ladas & Parry LLP

(57) ABSTRACT

Provided is a millimeter wave oscillator for generating a high frequency signal required in wireless communication. The millimeter wave oscillator uses an overwritten fiber Bragg grating and a light detector such that two wavelengths in a certain phase relationship are produced to generate a signal of a millimeter wave band with a high frequency, whereby a light source is readily obtained without signal processing for phase lock.

9 Claims, 2 Drawing Sheets

MILLIMETER WAVE OSCILLATOR USING FIBER BRAGG GRATING

CROSS-REFERENCE TO RELATED APPLICATION

This application claims priority to and the benefit of Korean Patent Application No. 2004-83336, filed Oct. 18, 2004, the disclosure of which is incorporated herein by reference in its entirety.

BACKGROUND

1. Field of the Invention

The present invention relates to a millimeter wave oscillator using a fiber Bragg grating, and more particularly, to a millimeter wave oscillator using a fiber Bragg grating capable of producing a light source having two wavelengths in a certain phase relationship to generate a signal in a millimeter wave band having high frequencies.

2. Discussion of Related Art

In general, when a millimeter wave (more than several tens of GHz) is generated using two light sources, a phase correlation between the two light sources is low. Thus, when the beats occur, a phase noise is generated around the beat frequency. Therefore, in order to reduce such a phase noise, an electrical feedback circuit or an optical feedback circuit is arranged between the two light sources to provide a phase lock between the two light sources.

A laser injection locking system is disclosed, in U.S. Pat. No. 5,485,481 entitled "Fiber Grating Stabilized Diode Laser" by B. F. Ventrudo, et. al., in which with a phase modulated primary laser signal inserted into a secondary laser, when the frequency of the inserted signal approaches a free running frequency of the secondary laser, the signal of the primary laser captures an output of the secondary laser and an output spectrum of the secondary laser is fixed at the inserted frequency In addition, Masahiro ogusu, et. al. propose that, using a distributed feedback (DFB) laser diode as a primary light source, signals are externally modulated by 7 to 30 GHz and inserted through an optical circulator into a Fabry-Perot laser diode where a mode is oscillated in a gap of the frequency difference of the millimeter wave (60 GHz). For the modulated primary light source signal, harmonic waves are generated at intervals of 30 GHz so that when two modes with a frequency difference corresponding to the millimeter frequency of Fabry-Perot diode modes approach frequencies of the harmonic waves, all of the Fabry-Perot diodes are fixed to the frequencies of the harmonic waves of the primary light source.

As described above, injection locking should be conducted between two light sources to reduce a phase noise, so that there is a need for complicated optical and electrical apparatuses such as a high frequency modulator.

SUMMARY OF THE INVENTION

The present invention is directed to a millimeter wave oscillator using a fiber Bragg grating, which uses an overwritten fiber Bragg grating and an optical circulator to generate light having two constant wavelengths so as to detect a beat frequency corresponding to a frequency difference of two rays without a device operating in a high frequency band such as a high frequency modulator for performing a phase lock between two light sources or a external signal processing in order to reduce a phase noise generated as described above.

One aspect of the present invention is to provide a millimeter oscillator using a fiber Bragg grating, comprising: a light source for generating an optical signal having a predetermined line width; a fiber Bragg grating for receiving the optical signal generated from the light source to reflect optical signals of two wavelengths having a frequency difference corresponding to a desired millimeter wave; a directional coupler for receiving the optical signal reflected from the fiber Bragg grating to output the received optical signal to different output ports; a first type of laser for receiving the optical signal output from one output port of the directional coupler to output an optical signal with a wavelength of the input optical signal fixed; a second type of laser for receiving the optical signal output from the other output port of the directional coupler to output an optical signal with a wavelength of the input optical signal fixed; and a light detector for detecting the optical signals output from the first and second types of laser through the directional coupler.

Another aspect of the present invention is to provide a millimeter wave oscillator using a fiber Bragg grating, comprising: a gain medium for generating a predetermined optical signal; a pump source for driving the gain medium; a resonating mirror and a fiber Bragg grating connected to both sides of the gain medium, respectively, for receiving the optical signal generated from the gain medium to reflect the optical signal such that an optical signal of two wavelengths having a frequency difference corresponding to a millimeter wave repetitively makes a round trip; and a light detector for detecting an optical signal that transmits the fiber Bragg grating.

Here, the fiber Bragg grating may be an overwritten Bragg grating.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIRST EMBODIMENT

Figure 1:
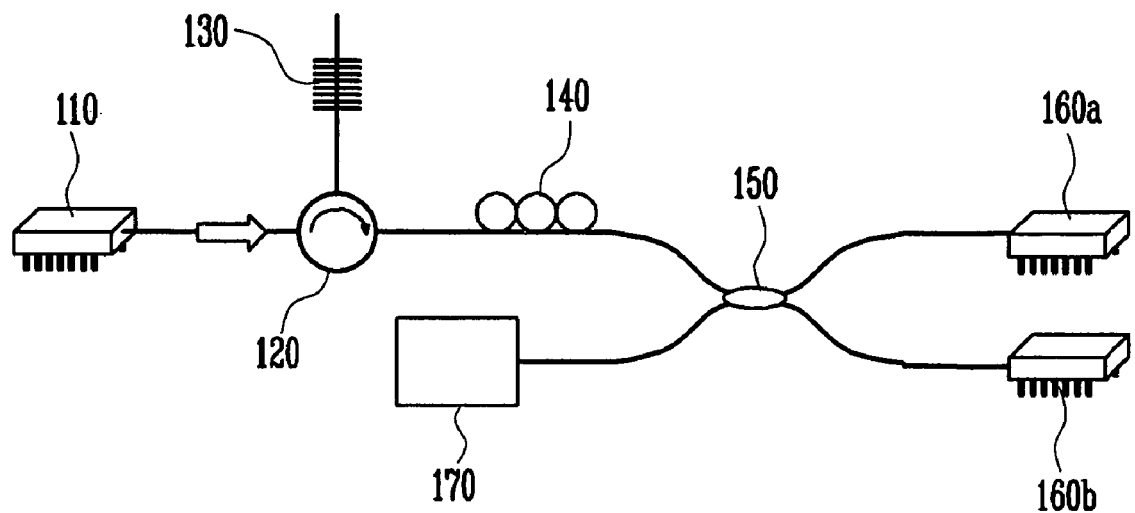
FIG. 1 is a schematic diagram of a millimeter wave oscillator using a fiber Bragg grating according to a first embodiment of the present invention.

FIG. 1 is a schematic diagram of a millimeter wave oscillator using a fiber Bragg grating according to a first embodiment of the present invention.

Referring to FIG. 1, the millimeter wave oscillator according to the first embodiment of the present invention includes a light source 10, an optical circulator 120, a fiber Bragg grating 130, a polarization controller 140, a directional coupler 150, first and second types of lasers 160a and 160b, and a light detector 170.

Here, the light source 110 is used to generate an optical signal having a predetermined line width, which is preferably a light source having a larger line width than a band of two wavelengths with a frequency spacing corresponding to a millimeter wave frequency. The light source 10 may use a light emitting diode (LED), a super luminescent diode (SLD), or a semiconductor laser.

The optical circulator 120 is used to input an optical signal generated from the light source 110 into the fiber Bragg grating 130, and inject an optical signal reflected from the fiber Bragg grating 130 into the first and second types of laser 160a and 160b as well as block an optical signal reflected back through the directional coupler 150. The optical circulator 120 may be additionally included in a basic component of the millimeter wave oscillator according to an embodiment of the present invention.

In addition, the optical circulator 120 is connected to the light source 110, the fiber Bragg grating 130, and the directional coupler 150, respectively, to input the optical signal generated from the light source 110 into the fiber Bragg grating 130 and output the optical signal reflected from the fiber Bragg grating 130 to the other port such that the optical signal is propagated to the directional coupler 150.

The fiber Bragg grating 130 is used to receive the optical signal generated from the light source 110 and reflect an optical signal having two wavelengths with a frequency difference corresponding to a desired millimeter wave.

The fiber Bragg grating 130 is overwritten, which may be implemented by overwriting a grating having different spatial intervals at the same position. Therefore, a frequency difference of two wavelengths reflected at the fiber Bragg grating 130 is identical to the millimeter wave frequency.

In other words, overwriting is conducted twice at the same place using the same mask, one conducted with the optical fiber as it as while the next one conducted after applying a certain tension. At this time, the intensity of tension is based on a condition where central wavelengths of two gratings have a difference by a frequency of the high frequency oscillator. Here, the applied tension is represented as shown in Equation 1.

$$\varepsilon = \frac{1}{(1-P_\varepsilon)} \cdot \frac{\Delta\lambda_B}{\lambda_B} = \frac{1}{\left[1 - \frac{n^2}{2}\{P_{12} - \mu(P_{11} + P_{12})\}\right]} \cdot \frac{\Delta\lambda_B}{\lambda_B} \quad \text{[Equation 1]}$$

where $P_{ij}$ is a Pockel coefficient upon being pulled and $\lambda_B$ is a Bragg wavelength.

In addition, overwriting is conducted twice at the same place using two masks with different periods. At this time, a gap of the mask has a relationship as shown in Equation 2.

$$\lambda_B = 2n \cdot \Lambda \quad \text{[Equation 2]}$$

where, $\Lambda$ is a period of a Bragg grating and n is an effective refractive index of a fiber core. A difference of a grating period of two masks can be represented as shown in Equation 3.

$$\Delta\Lambda = \frac{\Delta\lambda}{2n} \quad \text{[Equation 3]}$$

The optical signal reflected from the overwritten fiber Bragg grating 130 having a reflection spectrum at two wavelengths as described above passes through the directional coupler 150 by way of the optical circulator 120. At this time, the overwritten fiber Bragg grating 130 generates light having two wavelengths with a frequency difference corresponding to a desired millimeter wave frequency, and at the same time, may reduce a temperature effect because two gratings are under the same environment.

The directional coupler 150 is used to receive the optical signal reflected from the fiber Bragg grating 130 to output the receive optical signal to different output ports, and the respective output ports are connected to the first and second types of laser 160a and 160b. Further, the directional coupler 150 is preferably implemented with a fiber directional coupler having a coupling intensity of 50:50.

Additionally, a polarization controller 140 may be further included between the optical circulator 120 and the directional coupler 150 to control a polarization of the optical signal input to the first and second types of laser 160a and 160b.

The first and second types of laser 160a and 160b are used to receive the optical signal output from the different output ports of the directional coupler 150, respectively, and to output the optical signal with the wavelength of the optical signal input respectively.

Here, each of the central wavelengths for the first and second types of laser 160a and 160b has a wavelength around two wavelengths reflected from the fiber Bragg grating 130. To match the polarization of the optical signal input to the first and second types of laser 160a and 160b, the optical signal passes through the polarization controller 140 before being input to the first and second types of laser 160a and 160b.

Each output of the first and second types of laser 160a and 160b is output through the directional coupler 150 to the other port of the directional coupler 150. Further, the optical signal output by the optical circulator 120 from the first and second types of laser 160a and 160b is not reflected to the input light source 110.

The light detector 170 is connected to the other port of the directional coupler 150 and detects an optical signal output from the first and second types of laser 160a and 160b to make a beat phenomenon, serving to electrically generate a high frequency signal corresponding to a frequency difference of two optical signals.

Operation of the millimeter wave oscillator using the fiber Bragg grating according to the first embodiment of the present invention having the above-mentioned arrangement will now be described in detail.

Referring to FIG. 1, an optical signal generated from the light source 110 passes through the optical circulator 120 and is input to the overwritten fiber Bragg grating 130. The optical signal reflected from the fiber Bragg grating 130 passes through the 50:50 fiber directional coupler 150 such that it is input to the first and second types of laser 160a and 160b by way of the optical circulator 120.

The optical signal input to the first and second types of laser 160a and 160b, respectively, through the directional coupler 150 fixes an output frequency of the first and second types of laser 160a and 160b to a wavelength of the input optical signal.

Further, the optical signal output from the first and second types of laser 160a and 160b is output again through the directional coupler 150 to the other port. The output optical signal generates a high frequency electrical signal corresponding to a frequency difference of two optical signals due to a beat phenomenon at the light detector 170.

SECOND EMBODIMENT

Figure 2:
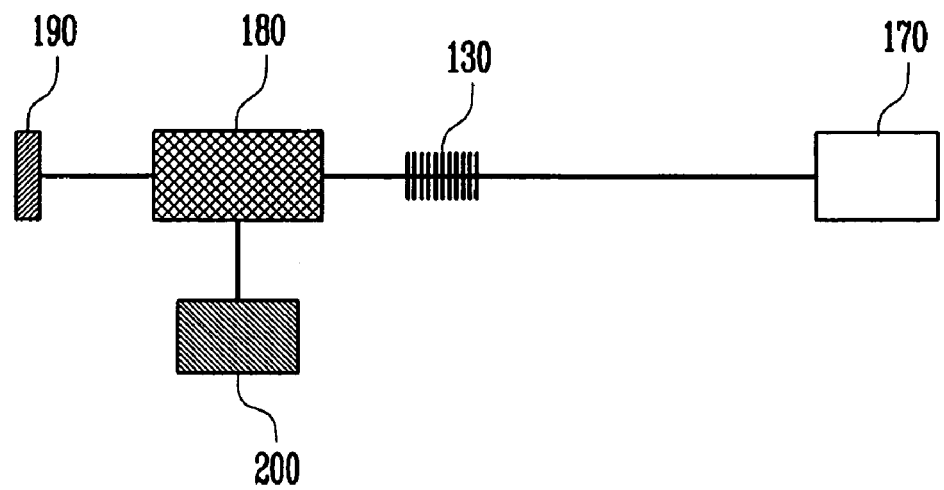
FIG. 2 is a schematic diagram of a millimeter wave oscillator using a fiber Bragg grating according to a second embodiment of the present invention.

FIG. 2 is a schematic diagram of a millimeter wave oscillator using a fiber Bragg grating according to a second embodiment of the present invention; in which the overwritten fiber Bragg grating 130 and the light detector 170 are the same element as those in the first embodiment, so that the detailed description related thereto will refer to the description concerning the first embodiment.

Referring to FIG. 2, the millimeter wave oscillator according to the second embodiment of the present invention includes a pumping source 200, a gain medium of a semiconductor or a fiber laser 180, a laser resonating mirror 190, an overwritten fiber Bragg grating 130 and a light detector 170.

Here, the gain medium 180 driven by the pumping source 200 emits light over a large area through pumping. The light generated from the gain medium 180 makes a round trip repetitively along a resonator, as an optical signal of two wavelengths with a frequency difference corresponding to the millimeter wave, by the overwritten fiber Bragg grating 130 connected at one side and the laser resonating mirror 190 connected to the other side. At this time, the two wavelengths are determined by the reflection wavelength of the overwritten fiber Bragg grating 130.

Further, for the millimeter wave resonator according to the second embodiment of the present invention as described above, a polarization controller (not shown) may be further included between the gain medium 180 and the overwritten fiber Bragg grating 130 to stably output laser.

Here, the output light refers to light that transmits the overwritten fiber Bragg grating 130, and the output wavelength of laser is identical to the reflection wavelength of the fiber Bragg grating 130, and thus, a high frequency millimeter wave is output due to a beat phenomenon at the light detector 170. In addition, reflectivity of two wavelengths of the overwritten fiber Bragg grating 130 is relevant to the laser output, so that it is desirable that the same reflectivity be provided.

Figure 3:
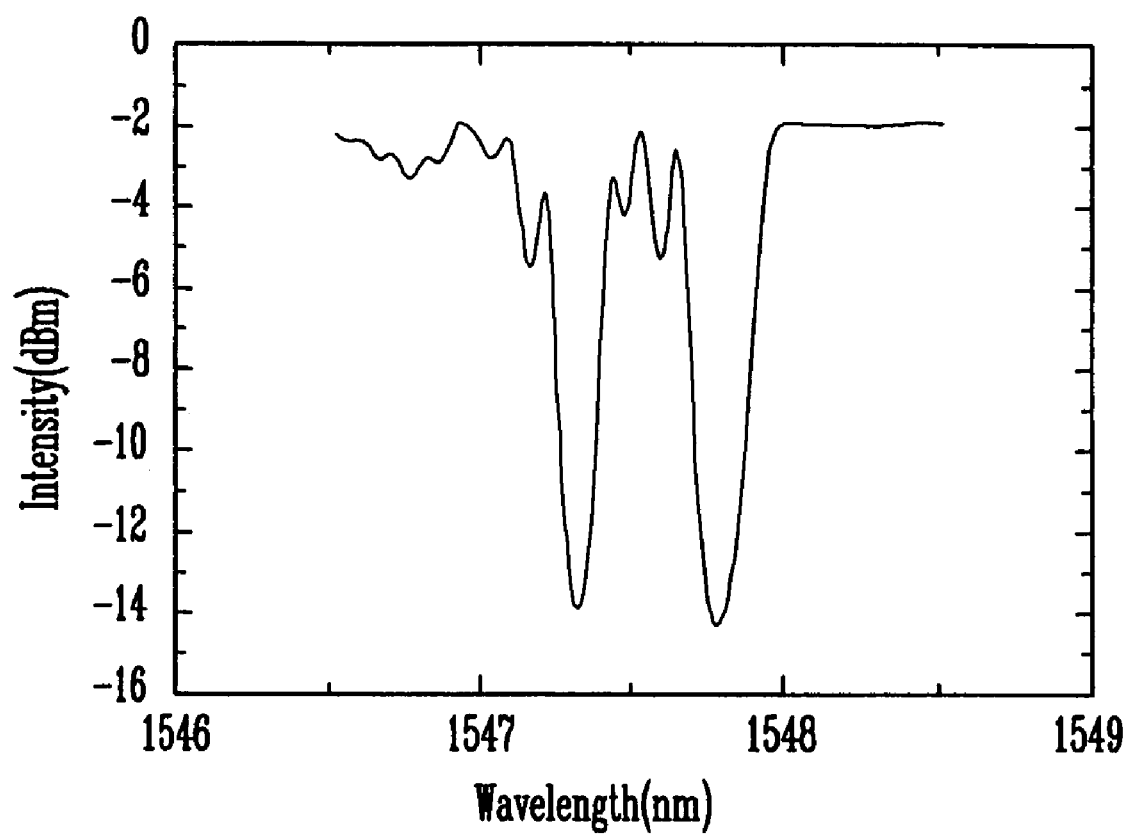
FIG. 3 is a graph showing an experimental measurement result of transmission band spectrum characteristics of an overwritten fiber Bragg grating for use in an embodiment of the present invention.

FIG. 3 is a graph showing an experimental measurement result of transmission band spectrum characteristics of an overwritten fiber Bragg grating for use in an embodiment of the present invention, in which a frequency difference of two wavelengths reflected at the fiber Bragg grating is identical to the millimeter wave frequency.

According to a millimeter wave oscillator using a fiber Bragg grating of the present invention as described above, an optical signal having two wavelengths with a constant phase is generated using an overwritten fiber Bragg grating and an optical circulator, without a high frequency band device, such as an existing high frequency modulator, for external signal processing or phase locking between two light sources, and a beat frequency corresponding to a frequency difference of two optical signals is detected. Therefore, a millimeter wave light source can be readily obtained without signal processing for phase locking.

In addition, according to the present invention, an optical signal generated from a semiconductor or a fiber gain medium is received, and an optical signal having two wavelengths with a constant phase is generated using a resonating mirror and a fiber Bragg grating by which an optical signal of two wavelengths with a frequency difference corresponding to a millimeter wave is reflected to repetitively make a round trip, and then a beat frequency corresponding to a frequency difference of two optical signals is detected. Therefore, a millimeter wave light source can be readily obtained without signal processing for phase locking.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A millimeter oscillator using a fiber Bragg grating, comprising:
    a light source for generating an optical signal having a predetermined line width;
    a fiber Bragg grating for receiving the optical signal generated from the light source to reflect optical signals of two wavelengths having a frequency difference corresponding to a desired millimeter wave;
    a directional coupler for receiving the optical signal reflected from the fiber Bragg grating to output the received optical signal to different output ports;
    a first type of laser for receiving the optical signal output from one output port of the directional coupler to output an optical signal with a wavelength of the input optical signal fixed;
    a second type of laser for receiving the optical signal output from the other output port of the directional coupler to output an optical signal with a wavelength of the input optical signal fixed; and
    a light detector for detecting the optical signals output from the first and second types of laser through the directional coupler.

2. The millimeter wave oscillator according to claim 1, wherein the directional coupler is a fiber directional coupler with a coupling rate of 50%.

3. The millimeter wave oscillator according to claim 1, wherein the fiber Bragg grating is an overwritten Bragg grating.

4. The millimeter wave oscillator according to claim 1, further comprising an optical circulator connected to the light source, the fiber Bragg grating, and the directional coupler, respectively, to input an optical signal generated from the light source to the fiber Bragg grating and couple an optical signal reflected from the fiber Bragg grating to the directional coupler.

5. The millimeter wave oscillator according to claim 4, further comprising a polarization controller connected between the optical circulator and the directional coupler for controlling polarization of the optical signals input to the first and second types of laser.

6. A millimeter wave oscillator using a fiber Bragg grating, comprising:
    a gain medium for generating a predetermined optical signal;
    a pump source for driving the gain medium;

a resonating mirror and a fiber Bragg grating connected to both sides of the gain medium, respectively, for receiving the optical signal generated from the gain medium to reflect the optical signal such that an optical signal of two wavelengths having a frequency difference corresponding to a millimeter wave repetitively makes a round trip; and a light detector for detecting an optical signal that transmits the fiber Bragg grating.

7. The millimeter wave oscillator according to claim 6, further comprising a polarization controller connected between the gain medium and the fiber Bragg grating for stably outputting the laser.

8. The millimeter wave oscillator according to claim 6, wherein the fiber Bragg grating is an overwritten Bragg grating.

9. The millimeter wave oscillator according to claim 6, wherein the gain medium is one of a semiconductor and a fiber gain medium.

* * * * *